US011538508B2

(12) United States Patent
Gibbons et al.

(10) Patent No.: US 11,538,508 B2
(45) Date of Patent: Dec. 27, 2022

(54) MEMORY MODULE MULTIPLE PORT BUFFER TECHNIQUES

(71) Applicant: Micron Technology, Inc., Boise, ID (US)

(72) Inventors: Jasper S. Gibbons, Meridian, ID (US); Matthew A. Prather, Boise, ID (US); Brent Keeth, Boise, ID (US); Frank F Ross, Boise, ID (US); Daniel Benjamin Stewart, Boise, ID (US); Randall J. Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/137,975

(22) Filed: Dec. 30, 2020

(65) Prior Publication Data

US 2021/0201966 A1 Jul. 1, 2021

Related U.S. Application Data

(60) Provisional application No. 62/955,682, filed on Dec. 31, 2019.

(51) Int. Cl.
*G11C 7/10* (2006.01)
*G11C 7/22* (2006.01)

(52) U.S. Cl.
CPC .......... *G11C 7/1075* (2013.01); *G11C 7/1057* (2013.01); *G11C 7/1084* (2013.01); *G11C 7/222* (2013.01)

(58) Field of Classification Search
CPC ... G11C 7/1075; G11C 7/1084; G11C 7/1057; G11C 7/222
See application file for complete search history.

(56) References Cited

U.S. PATENT DOCUMENTS

| 6,460,152 | B1 | 10/2002 | Demidov et al. |
| 7,640,386 | B2 * | 12/2009 | Coteus ................ G06F 13/4247 710/14 |
| 7,717,752 | B2 * | 5/2010 | Loughner ................ G11C 5/04 439/633 |

(Continued)

FOREIGN PATENT DOCUMENTS

| CN | 113728383 A | 11/2021 |
| CN | 113767435 A | 12/2021 |

(Continued)

OTHER PUBLICATIONS

"International Application Serial No. PCT/US2020/019259, International Search Report dated Jun. 19, 2020", 6 pgs.

(Continued)

*Primary Examiner* — Tri M Hoang
(74) *Attorney, Agent, or Firm* — Schwegman Lundberg & Woessner, P.A.

(57) ABSTRACT

The present disclosure provides techniques for using a multiple-port buffer to improve a transaction rate of a memory module. In an example, a memory module can include a circuit board having an external interface, first memory devices mounted to the circuit board, and a first multiple-port buffer circuit mounted to the circuit board. The first multiple-port buffer circuit can include a first port coupled to data lines of the external interface, the first port configured to operate at a first transaction rate, a second port coupled to data lines of a first plurality of the first memory devices, and a third port coupled to data lines of a second plurality of the first memory devices. The second and third ports can be configured to operate at a second transaction rate, wherein the second transaction rate is slower than the first transaction rate.

20 Claims, 12 Drawing Sheets

(56) References Cited

U.S. PATENT DOCUMENTS

| | | | |
|---|---|---|---|
| 8,069,379 B2* | 11/2011 | Perego | G11C 7/1075 |
| | | | 714/718 |
| 8,275,936 B1* | 9/2012 | Haywood | G06F 13/1657 |
| | | | 711/105 |
| 8,754,533 B2 | 6/2014 | Or-Bach et al. | |
| 8,984,189 B2 | 3/2015 | Casper et al. | |
| 9,357,649 B2* | 5/2016 | Chun | H05K 1/117 |
| 9,378,707 B2* | 6/2016 | Lee | G09G 3/3208 |
| 9,391,048 B2 | 7/2016 | Lee | |
| 9,489,009 B2* | 11/2016 | Lee | G06F 1/12 |
| 9,519,315 B2* | 12/2016 | Connolly | G11C 11/4093 |
| 10,528,267 B2* | 1/2020 | Batra | G06F 3/0679 |
| 10,621,043 B2 | 4/2020 | Casper et al. | |
| 10,628,295 B2 | 4/2020 | Gu et al. | |
| 10,649,680 B2* | 5/2020 | Riley | G06F 3/0679 |
| 10,733,500 B2 | 8/2020 | Andreopoulos et al. | |
| 10,740,033 B2 | 8/2020 | Kim et al. | |
| 10,877,857 B2 | 12/2020 | Park | |
| 10,922,607 B2 | 2/2021 | Sengupta et al. | |
| 2004/0163028 A1 | 8/2004 | Olarig | |
| 2004/0233721 A1 | 11/2004 | Kim et al. | |
| 2006/0107186 A1 | 5/2006 | Cowell et al. | |
| 2006/0126369 A1 | 6/2006 | Raghuram | |
| 2006/0233012 A1 | 10/2006 | Sekiguchi et al. | |
| 2008/0109597 A1 | 5/2008 | Schakel et al. | |
| 2008/0123459 A1 | 5/2008 | Rajan et al. | |
| 2008/0136002 A1 | 6/2008 | Yang | |
| 2009/0021874 A1 | 1/2009 | Divito et al. | |
| 2009/0103345 A1 | 4/2009 | Mclaren et al. | |
| 2009/0248969 A1 | 10/2009 | Wu et al. | |
| 2010/0091537 A1 | 4/2010 | Best et al. | |
| 2012/0051152 A1 | 3/2012 | Hollis | |
| 2012/0102292 A1 | 4/2012 | Rajan et al. | |
| 2012/0284436 A1 | 11/2012 | Casper et al. | |
| 2014/0358834 A1 | 12/2014 | Kim et al. | |
| 2015/0155876 A1 | 6/2015 | Jayasena et al. | |
| 2016/0284424 A1 | 9/2016 | Das et al. | |
| 2016/0329303 A1 | 11/2016 | Ye et al. | |
| 2017/0194962 A1 | 7/2017 | Bains et al. | |
| 2017/0255552 A1 | 9/2017 | Chatterjee et al. | |
| 2017/0323875 A1 | 11/2017 | Tam | |
| 2018/0068217 A1 | 3/2018 | Eleftheriou et al. | |
| 2018/0102344 A1 | 4/2018 | Ramachandra et al. | |
| 2018/0174996 A1 | 6/2018 | Mostovoy et al. | |
| 2018/0225235 A1 | 8/2018 | Lee | |
| 2018/0309451 A1 | 10/2018 | Lu et al. | |
| 2019/0318230 A1 | 10/2019 | Cho et al. | |
| 2020/0143229 A1 | 5/2020 | Van Der Made et al. | |
| 2020/0272560 A1 | 8/2020 | Keeth et al. | |
| 2020/0272564 A1 | 8/2020 | Keeth et al. | |
| 2020/0279588 A1 | 9/2020 | Lym et al. | |
| 2021/0073616 A1 | 3/2021 | Moraitis et al. | |
| 2021/0200464 A1 | 7/2021 | Keeth | |
| 2021/0200699 A1 | 7/2021 | Keeth et al. | |
| 2021/0318956 A1 | 10/2021 | Keeth et al. | |
| 2021/0406660 A1 | 12/2021 | Chen | |

FOREIGN PATENT DOCUMENTS

| | | |
|---|---|---|
| CN | 114902332 A | 8/2022 |
| JP | 2016522495 A | 7/2016 |
| KR | 100988388 B1 | 10/2010 |
| KR | 20170029074 A | 3/2017 |
| WO | WO-2020172551 A1 | 8/2020 |
| WO | WO-2020172557 A1 | 8/2020 |
| WO | WO-2021133826 A1 | 7/2021 |
| WO | WO-2021138329 A1 | 7/2021 |
| WO | WO-2021138408 A1 | 7/2021 |

OTHER PUBLICATIONS

"International Application Serial No. PCT/US2020/019259, Written Opinion dated Jun. 19, 2020", 6 pgs.

"International Application Serial No. PCT/US2020/019269, International Search Report dated Jun. 18, 2020", 4 pgs.

"International Application Serial No. PCT/US2020/019269, Written Opinion dated Jun. 18, 2020", 7 pgs.

"International Application Serial No. PCT/US2020/066664, International Search Report dated Apr. 8, 2021", 4 pgs.

"International Application Serial No. PCT/US2020/066664, Written Opinion dated Apr. 8, 2021", 3 pgs.

"International Application Serial No. PCT/US2020/067319, International Search Report dated Apr. 19, 2021", 4 pgs.

"International Application Serial No. PCT/US2020/067319, Written Opinion dated Apr. 19, 2021", 4 pgs.

U.S. Appl. No. 17/356,906, filed Jun. 24, 2021, Memory Device Interface and Method.

U.S. Appl. No. 17/506,405, filed Oct. 20, 2021, Buffer Management of Memory Refresh.

U.S. Appl. No. 16/797,571, Final Office Action dated Jun. 11, 2021, 15 pgs.

U.S. Appl. No. 16/797,571, Response filed Oct. 12, 2021 to Final Office Action dated Jun. 11, 2021, 8 pgs.

U.S. Appl. No. 16/797,571, Notice of Allowance dated Oct. 28, 2021, 9 pgs.

U.S. Appl. No. 16/797,571, Notice of Allowance dated Feb. 18, 2022, 9 pgs.

U.S. Appl. No. 16/797,571, 312 Amendment filed Mar. 7, 2022, 3 pgs.

U.S. Appl. No. 16/797,571, PTO Response to Rule 312 Communication dated Mar. 11, 2022, 2 pgs.

U.S. Appl. No. 17/131,217, Non Final Office Action dated Mar. 25, 2022, 13 pgs.

"International Application Serial No. PCT/US2020/019259, International Preliminary Report on Patentability dated Sep. 2, 2021", 8 pgs.

"International Application Serial No. PCT/US2020/019269, International Preliminary Report on Patentability dated Sep. 2, 2021", 9 pgs.

"International Application Serial No. PCT/US2020/067447, International Search Report dated Apr. 27, 2021", 3 pgs.

"International Application Serial No. PCT/US2020/067447, Written Opinion dated Apr. 27, 2021", 4 pgs.

"International Application Serial No. PCT/US2021/055866, International Search Report dated Feb. 4, 2022", 4 pgs.

"International Application Serial No. PCT/US2021/055866, Written Opinion dated Feb. 4, 2022", 4 pgs.

"Chinese Application Serial No., Voluntary Amendment filed Mar. 21, 2022", w/English Claims, 16 pgs.

"Chinese Application Serial No. 202080030315.4, Voluntary Amendment filed Mar. 25, 2022", w/English Claims, 14 pgs.

"European Application Serial No. 20758657.9, Response Filed Apr. 11, 2022 to Communication Pursuant to Rules 161(2) and 162 EPC dated Oct. 1, 2021", 9 pgs.

"European Application Serial No. 20759297.3, Response Filed Apr. 19, 2022 to Communication Pursuant to Rules 161(2) and 162 EPC dated Oct. 5, 2021", 9 pgs.

"International Application Serial No. PCT/US2020/066664, International Preliminary Report on Patentability dated Jul. 7, 2022", 5 pgs.

"International Application Serial No. PCT/US2020/067319, International Preliminary Report on Patentability dated Jul. 14, 2022", 6 pgs.

"International Application Serial No. PCT/US2020/067447, International Preliminary Report on Patentability dated Jul. 14, 2022", 6 pgs.

"Chinese Application Serial No. 202080030311.6, Office Action dated Aug. 26, 2022", with English translation, 12 pages.

"European Application Serial No. 20758657.9, Extended European Search Report dated Sep. 22, 2022", 8 pgs.

"European Application Serial No. 20759297.3, Extended European Search Report dated Nov. 2, 2022", 9 pgs.

* cited by examiner

MEMORY MODULE MULTIPLE PORT BUFFER TECHNIQUES

PRIORITY AND RELATED APPLICATIONS

This application claims the benefit of priority to Gibbons et al., U.S. Provisional Patent Application Ser. No.: 62/955,682, titled, MEMORY MODULE MULTIPLE PORT BUFFER TECHNIQUES, filed on Dec. 31, 2019, hereby incorporated by reference herein in its entirety.

TECHNICAL FIELD

The following relates generally to memory modules and more specifically to increasing a data transfer rate of a memory module using a multiple-port buffer.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random-access memory (RAM), read only memory (ROM), DRAM, synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

Improving memory devices, generally, may include increasing memory cell density, increasing read/write speeds, increasing reliability, increasing data retention, reducing power consumption, or reducing manufacturing costs, among other metrics. Advancing memory technology has realized improvements for many of these metrics, however, as improvements in processing speed are developed, memory bandwidth can become a bottleneck to overall system performance improvements.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
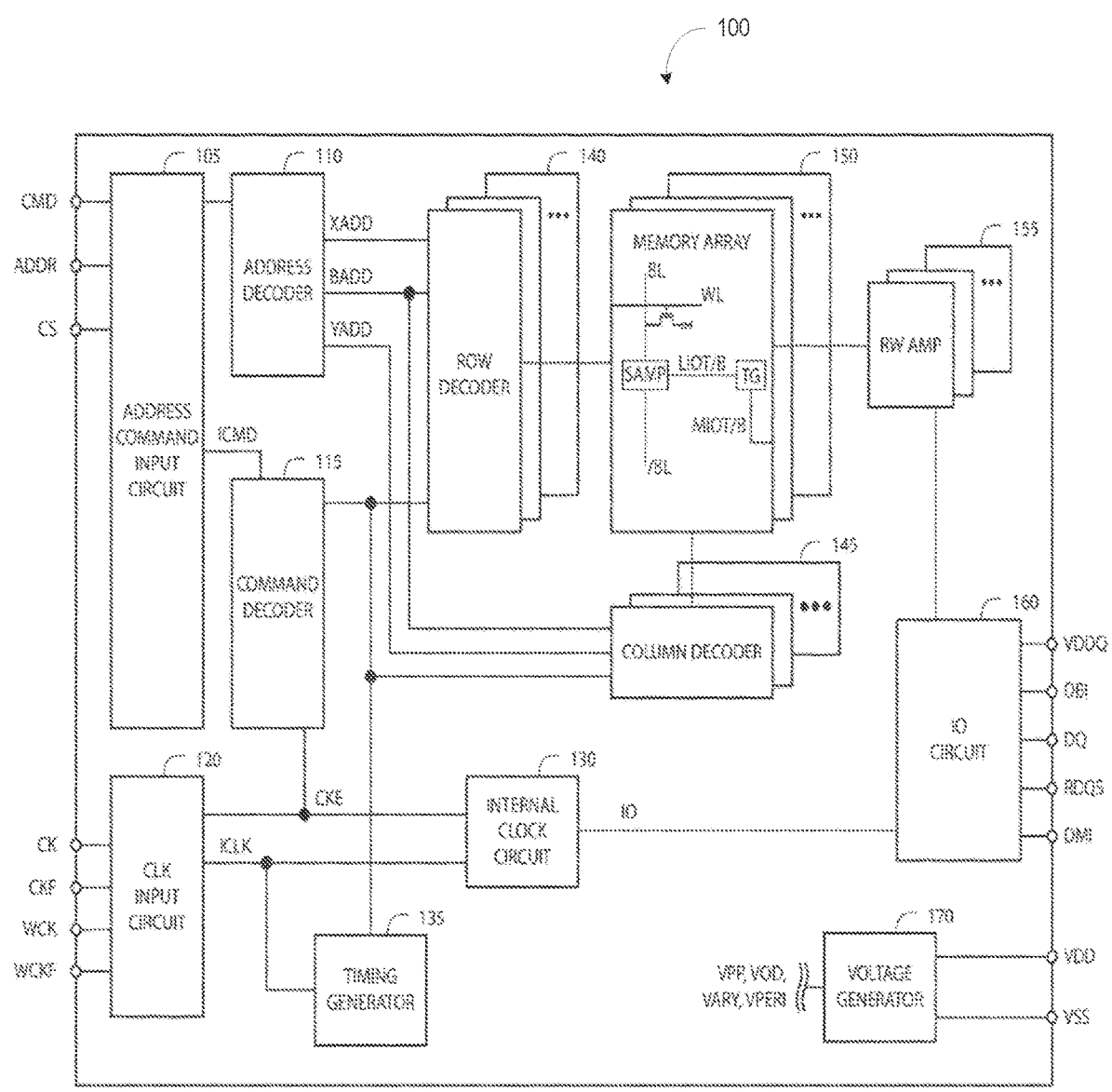
FIG. 1 is a block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded, and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK dock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data dock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external dock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can provide memory capacity with multiple memory arrays, or with a single array that is sub-divided into multiple separately-addressable portions (e.g., into multiple channels, banks, ranks, etc.). Alternatively, a memory system can include multiple memory devices such as the memory device 100 of FIG. 1, where each memory device represents a separately-addressable sub-division (e.g., rank, etc.) of the memory capacity of the system. Accordingly, a memory device or a memory system with multiple memory devices, ranks, channels, banks or the like can include multiple terminals (e.g., dock terminals, CMD/ADD terminals, I/O terminals, etc.) that are dedicated to one or more, but less than all of, the separately-addressable portions. For example, a multi-channel memory device can include multiple terminals, each corresponding to one of the multiple channels of memory.

Figure 2:
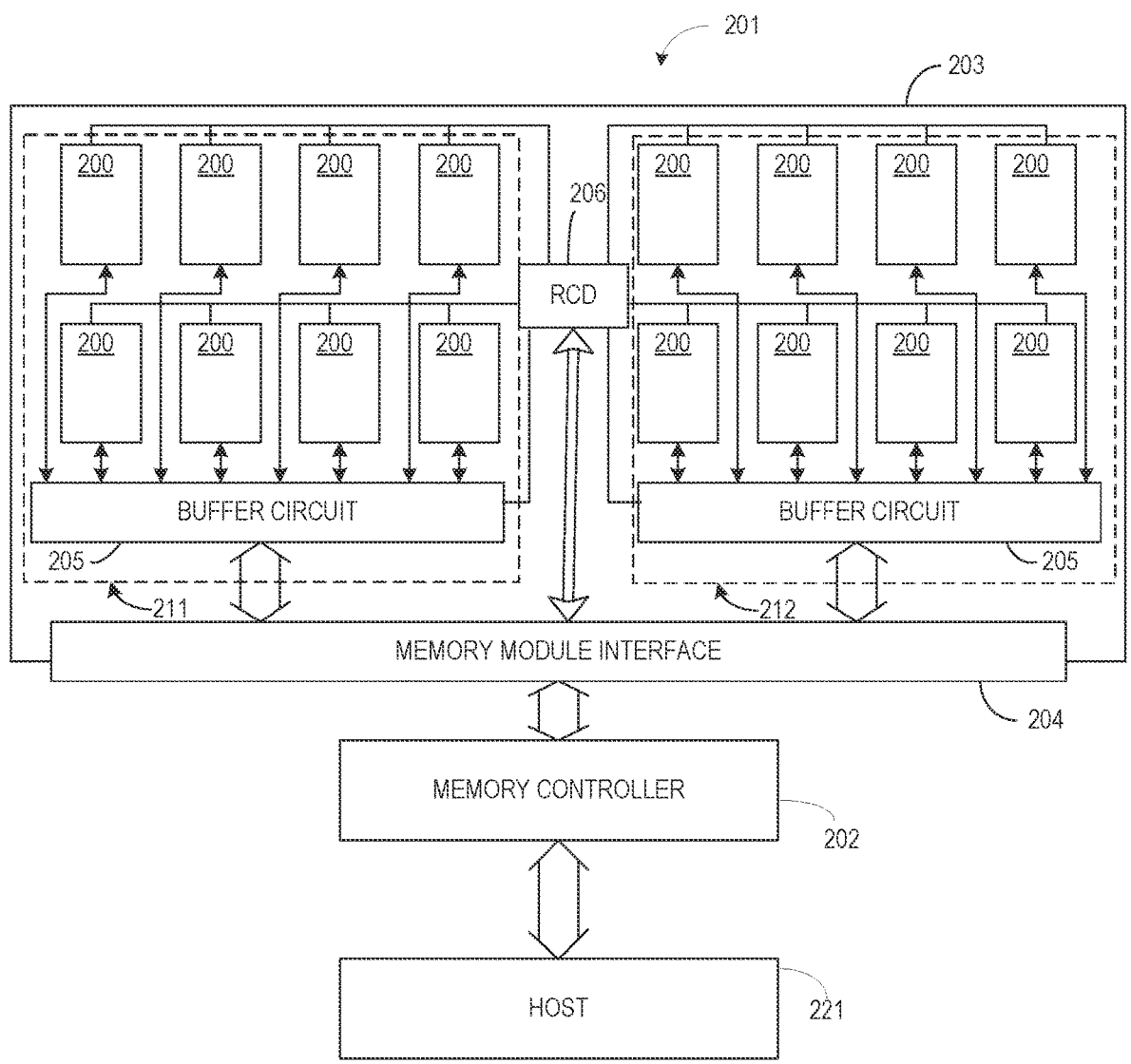
FIG. 2 is a simplified block diagram schematically illustrating a memory system in accordance with an embodiment of the present subject matter.

FIG. 2 is a simplified block diagram schematically illustrating a memory system 201 in accordance with an embodiment of the present subject matter. The system 201 can include a host device 221, a memory controller 202, and a memory module 203. The memory module can include multiple memory devices 2003, an interface 204, one or more buffer circuits 205 and a registered or registering clock driver (RCD) 206. The memory devices 200 can be used to store data of the host 221. The interface 204 can provide a communication path between the host device 221 and the memory module 203. The buffer circuits 205 can assist in increasing a transaction rate of the memory module 203 as discussed below. The RCD 206 may be configured to communicate with the memory controller 202 (or host device 221) on a first side, and with the components of the memory module 203 on a second side. The RCD 206 may receive, for example, command, address, and clock signals. In some cases, these command signals may include register command words (RCWs); and in other examples may include buffer control words (BCWs). The RCD 206 may, in some examples, provide signals to control, and in some cases train, the multiple-port buffer circuits 205. In certain examples, the RCD 206 may be configured to communicate with the memory controller through a 32-bit data bus operating at an established data transfer rate and modulate data signals of the memory devices 200 at a slower transfer rate. As will be apparent to persons skilled in the art the RCD 206 can implement additional functionality such as impedance calibration command/parity checking etc. Outputs of the RCD (for example, clock outputs command/address outputs control outputs etc. may be enabled in groups and/or otherwise individually controlled as desired.

The host device 221 can be operably coupled to the memory module 203 (e.g., a dual in-line memory module (DMA)) via the memory controller 202. In some examples, the memory module 203 can include the memory controller 202. The memory controller 202 can be operably coupled by a bus or interface 204 to a plurality of memory devices 200. In accordance with various examples of the present subject matter, the host device 221 can communicate with the memory module 203 to store and retrieve data in the memory devices 200. In the illustrated example, the memory controller 202 can communicate with the memory devices 200 via two channels 211, 212. In certain examples, the channels 211, 212 can be operated independently from each other. In some examples, the channels 211, 212 can share some signals such as command and address signals and can have independent data signals. In certain examples, the memory module 203 can include multiple-port channel buffer circuits 205. The multiple-port channel buffer circuits 205 can allow a transaction rate of the memory module interface 204 to be higher than a transaction rate of an individual memory device 200. In certain example, the multiple-port channel buffer circuits 205 can allow slower, but more energy efficient memory devices to be used with a memory controller capable of higher transaction rates. In certain examples, the transaction rate of the memory controller 202 compared to the transaction rate of a memory device 200 can be 2 times faster, 4 times faster, or even higher. In some examples, a multiple-port channel buffer circuit 205 can allow for additional ranks of memory for the system 201 compared to an unbuffered memory module or a memory module with a simple two-port buffer circuit.

Figure 3:
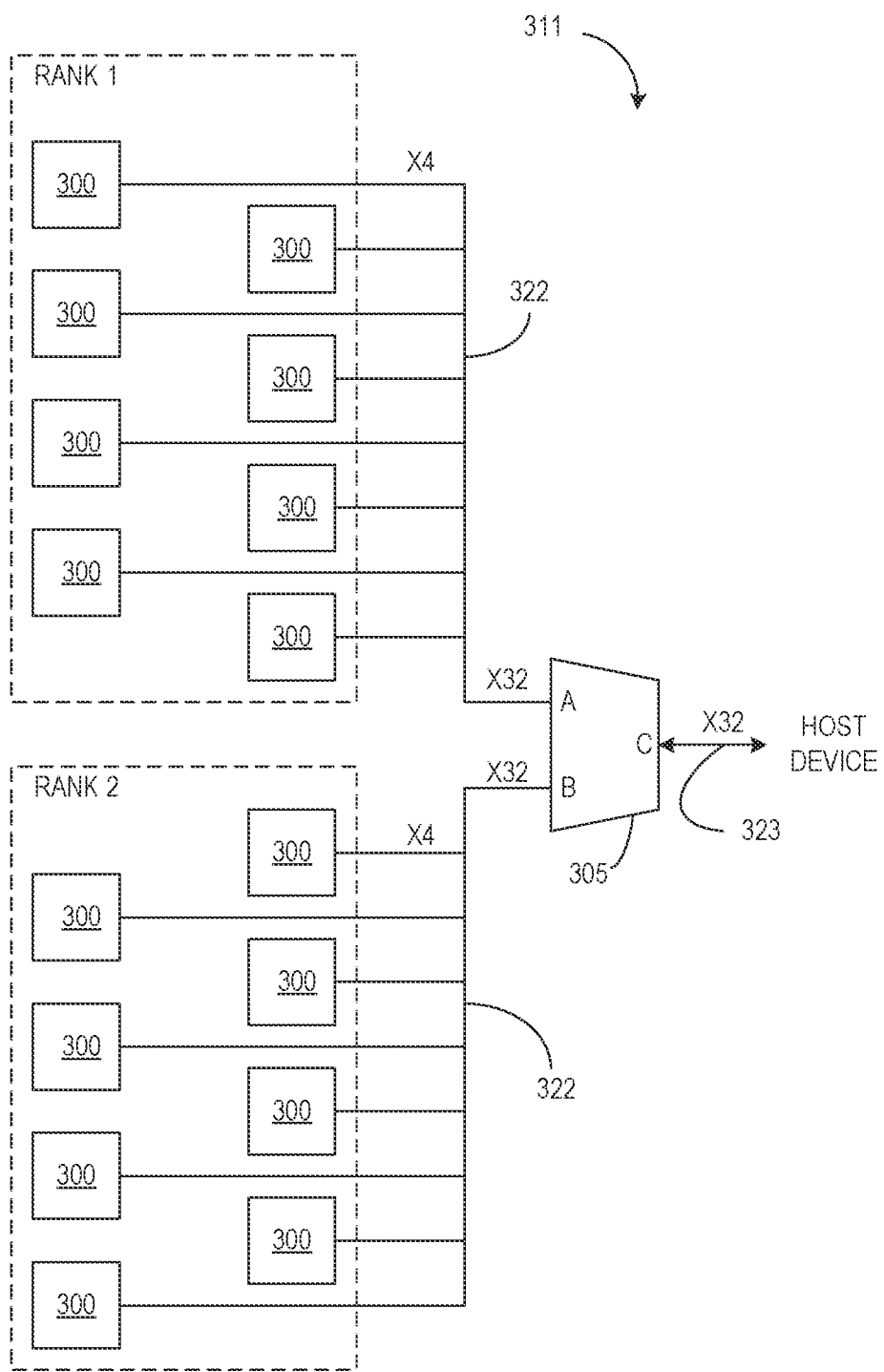
FIG. 3 illustrates generally a block diagram of a channel of an example two-channel memory module.

FIG. 3 illustrates generally a block diagram of a channel 311 of an example two-channel memory module. In certain examples, the channel 311 can include multiple memory devices 300, multiple memory data busses 322, a multiple-port channel buffer circuit 305, and a channel data bus 323. In certain examples, the memory devices 300 can be organized by rank and a channel 311 can include a first rank (RANK 1) of memory devices 300 and a second rank (RANK 2) of memory devices 300. The multiple-port channel buffer circuit 305 can simultaneously exchange data with each rank (RANK 1), RANK 2) of memory devices 300. In certain examples, the multiple-port channel buffer circuit 305 can exchange data with a host device. In certain examples, the data can pass between the channel data bus 323 and the host via an external interface of a memory module including the channel 311, a memory controller, or a combination thereof. In certain examples, the multiple-port channel buffer circuit 305 can exchange data with the host device while simultaneously exchanging data with the one or more ranks of memory of the memory devices 300 via the memory data busses 322. In some examples, the multiple-port channel buffer circuit 305 can include multiple, individual multiple-port data buffers. In the illustrated channel 311, each rank (RANK 1, RANK 2) of memory is directly coupled with a single port (A or B) of the multiple-port channel buffer circuit 305. In certain examples, the multiple-port channel buffer circuit 305 can allow full utilization of the transaction rate of the connected memory controller (202) or host (221) while using memory devices 300 having a much slower transaction rate. For example, in examples of double data rate type 5 (DDR5) DIMM memory modules employing example multiple-port channel buffer circuits, the transaction rate of the channel bus can be 6400 MT/sec while the memory data busses operate at 3200 MT/sec. In certain applications, the example multiple-port channel buffer circuit 305 can allow for expected speed performance of the channel bus 323 while using more energy efficient, slower, and often less expensive memory devices 300.

Figure 4:
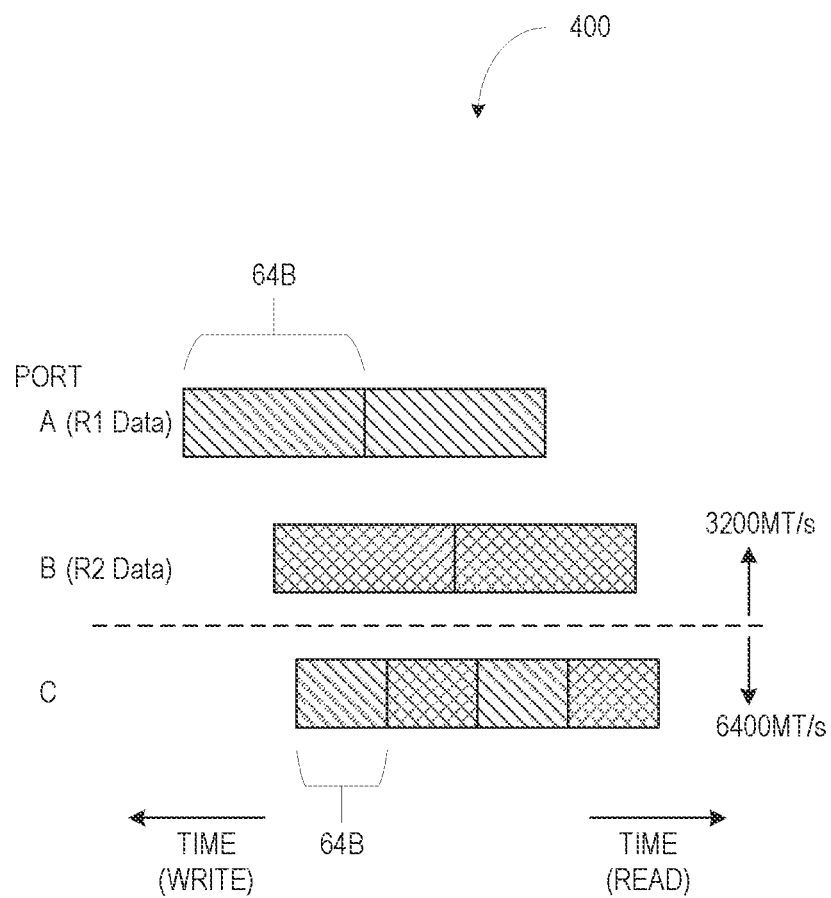
FIG. 4 illustrates graphically an example method of operating a memory module according to various examples of the present subject matter.

FIG. 4 illustrates graphically an example method 400 of operating a memory module according to various examples of the present subject matter. The method 400 of FIG. 4 illustrates the operation of an example memory module for a read operation and for a write operation, and specifically shows activity for the various ports (A, B, C) of a multiple-port channel buffer circuit such as the multiple-port channel buffer circuit 305 of FIG. 3. For a read operation, time moves from left to right. For a write operation, time moves from right to left. The particular example of FIG. 4 assumes the data for a read or write operation is located in memory devices of a first rank and of a second rank. The RCD (not shown) can receive commands from the memory controller. For the read command, the RCD can command the memory of the first rank (R1) to sense the first 64 bytes of read data and to forward the first read data to the memory module interface. A delay after initiating the sensing of the first read data of the first rank, the RCD can command. the memory of the second rank to sense a second 64 bytes of read data and forward the second read data to the memory module interface. Since the memory module includes a multiple-port channel buffer circuit, the memory devices of the first rank (R1) and the memory devices of the second rank (R2) can transfer the respective sensed data simultaneously. The multiple-port channel buffer circuit can use a first port (A) to receive the read data of the memory of the first rank (R1) and a second port (B) to receive the read data of the memory of the second rank (R2).

Upon buffering a certain amount of the first read data of the first port (A), the multiple-port channel buffer circuit can begin to send the read data to the host via a third port (C) of the multiple-port channel buffer circuit. In certain examples, the RCD can help schedule the order in which the read data of each rank is sent to via the third port (C). In some examples, the multiple-port channel buffer circuit can send the read data to the host in the same order as each rank began to send data to the respective first and second ports (A, B) of the multiple-port channel buffer circuit. As can be observed from FIG. 4, the overlapping transfer of data enabled by using the multiple-port channel buffer circuit allows a transfer rate of the memory devices to be half the transfer rate of the memory controller. If additional data is to be read by the read command, the RCD can continue to alternate sense commands to the first and second ranks of memory to retrieve the additional read data.

For a write command, the RCD can coordinate reception of the write data with the memory controller. The multiple-port channel buffer circuit can use the third port (C) to receive the write data from the host and can buffer the received data. The RCD can coordinate transfer of the received write data from the multiple-port channel buffer circuit to memory of the first and second rank (R1, R2) via the first and second ports (A, B) of the multiple-port channel buffer circuit. For example, soon after first receiving a portion of a first 64 bytes of write data, the multiple-port channel buffer circuit can begin transferring the first 64 bytes to memory of the second rank (R2) using the second port (B). Upon beginning to receive a second 64 bytes of write data, the multiple-port channel buffer circuit can begin transferring the second 64 bytes of write data to memory of the first rank (R1) using the first port (A). In certain examples, transferring the write data from the multiple-port channel buffer circuit to memory of the first rank (R1) and transferring the write data from the multiple-port channel buffer circuit to memory of the second rank (R2) can happen simultaneously. If additional data is to be written as part of the write command, the RCD can continue to alternate the transfer of the additional write data to the first and second ranks of memory via the first and second ports (A, B) of the multiple-port channel buffer circuit. In the illustrated example of FIGS. 3 and 4, the burst length of the memory devices is 16 using a 4-bit wide data bus and the burst length of the channel bus to the memory controller is 16 using a 32-bit wide data bus.

Figure 5:
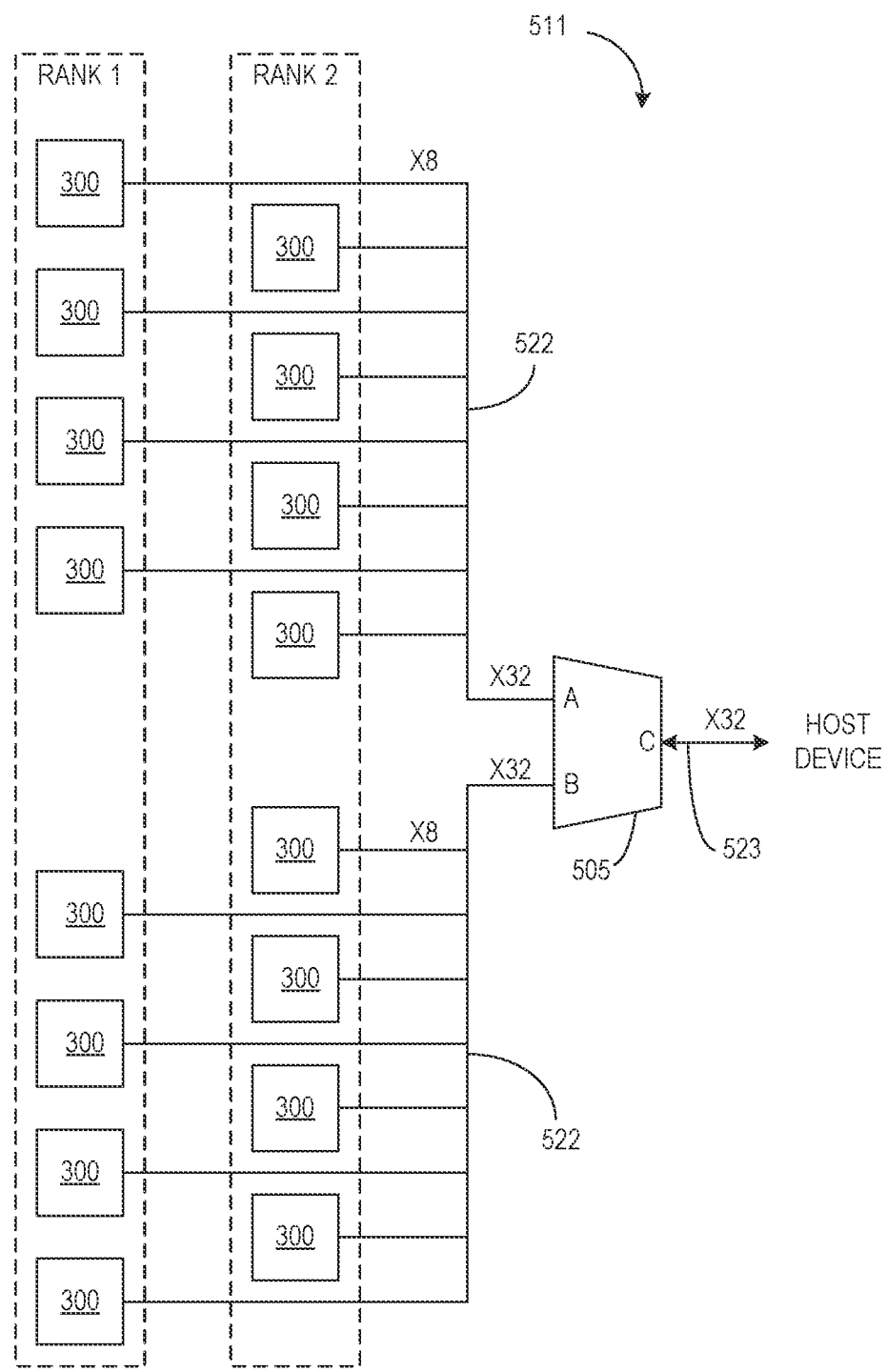
FIG. 5 illustrates generally a block diagram of a channel of an example two-channel memory module.

FIG. 5 illustrates generally a block diagram of a channel 511 of an example two-channel memory module. In certain examples, the channel 511 can include multiple memory devices 500, multiple data busses 522, a multiple-port channel buffer circuit 505, and a channel data bus 523. In certain examples, the memory devices 500 can be organized by rank and the channel 511 can include a first rank (RANK 1) of memory devices and a second rank (RANK 2) of memory devices. The multiple-port channel buffer circuit 505 can simultaneously exchange data with each rank of memory devices. In certain examples, the multiple-port channel buffer circuit can exchange data with a host device via the channel data bus 523 while simultaneously exchanging data with the one or more ranks of memory of the memory devices 500. In some examples, the multiple-port channel buffer circuit 505 can include multiple, individual multiple-port data buffers. In the illustrated channel 511, each rank (RANK 1, RANK 2) of memory is coupled with more than one port (A, B) of the multiple-port channel buffer circuit 505. In certain examples, the multiple-port channel buffer circuit 505 can allow full utilization of the transaction rate of a connected memory controller or host device while using memory devices 500 having a much slower transaction rate. For example, in examples of DDR5 DIMM memory modules employing example multiple-port channel buffer circuits, the transaction rate of the channel bus can be 6400 MT/sec while the memory data busses operate at 3200 MT/sec. In certain applications, the example multiple-port channel buffer circuit 505 can allow for expected speed performance of the channel bus 523 while using more energy efficient, slower, and often less expensive memory devices 500.

Figure 6:
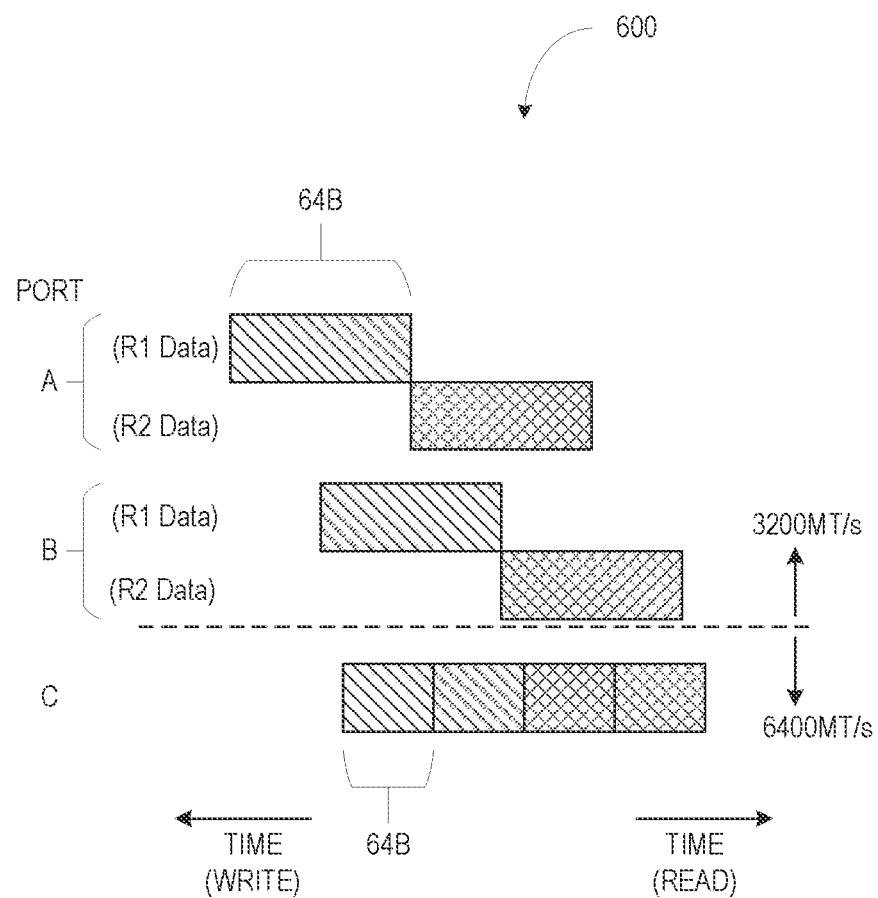
FIG. 6 illustrates graphically an example method of operating a memory module according to various examples of the present subject matter.

FIG. 6 illustrates graphically an example method 600 of operating a memory module according to various examples of the present subject matter. The method 600 of FIG. 6 illustrates the operation of an example memory module for a read operation and for a write operation. For read operation time moves from left to right. For a write operation, time moves from right to left. The particular example of FIG. 6 assumes the data for the read or write command is located in memory devices of a first rank (R1) and of a second rank (R2). The RCD of the memory module can receive the commands from the memory controller and can provide command information, address information and clock information to the memory devices of each rank (R1, R2). The RCD can also provide control information and clock information to the multiple-port channel buffer circuit. For a read command, the RCD can command the memory of a first portion of the first rank (R1) to sense the first 64 bytes of read data and to forward the data to the memory module interface via a first port (A) of the multiple-port channel buffer circuit. A short delay after initiating the sensing of the first read data of the first rank (R1), the RCD can command the memory of a second portion of the first rank (R2) to sense a second 64 bytes of read data and forward the sensed data to the memory module interface via a second port (B) of the multiple-port channel buffer circuit. Since the memory module includes a multiple-port channel buffer circuit, the memory devices of the first portion of the first rank (R1) and the memory devices of the second portion of the first rank (R2) can transfer the respective sensed data simultaneously. The multiple-port channel buffer circuit can use a first port (A) to receive the first read data and a second port (B) to receive the second read data.

Upon buffering a certain amount of data of the first portion, the multiple-port channel buffer circuit can begin to send the first read data to the host via a third port (C) of the multiple-port channel buffer circuit. In certain examples, the RCD can help schedule the order in which the data of each rank (R1, R2) is sent via the third port (C). In some examples, the multiple-port channel buffer circuit can send the data to the host in the same order as each rank began to send the read data to the multiple-port channel buffer circuit. As can be observed from FIG. 6, the overlapping transfer of data enabled by using the multiple-port channel buffer circuit allows transfer rate of the memory devices to be half the transfer rate of the memory controller. If additional data is to be read by the read command, the RCD can continue to alternate sense commands to the different portion of the first and second ranks (R1, R2) of memory to retrieve the additional data.

For the write command, the RCD can coordinate reception of the write data with the memory controller. The multiple-port channel buffer circuit can use the third port (C) to receive write data from the host device and can buffer the received write data. The RCD can coordinate transfer of the received write data from the multiple-port channel buffer circuit to memory of the first and second ranks (R1, R2). For example, soon after receiving a first 64 bytes of write data, the multiple-port channel buffer circuit can begin transferring the first 64 bytes to a portion of memory of the second rank (R2) using the second port (B) (time flowing from right to left in FIG. 6 for a write operation). Upon beginning to receive a second 64 bytes of write data, the multiple-port channel buffer circuit can begin transferring the second 64 bytes of write data to a second portion of memory of the second rank (R2) using the first port (B). In certain examples, transferring the first write data from the multiple-port channel buffer circuit to the first portion of memory of the second rank (R2) and transferring the second write data from the multiple-port channel buffer circuit to the second portion of memory of the second rank (R2) can happen simultaneously. If additional data is to be written as part of the write command, the RCD can continue to alternate the transfer of the additional write data to portions of the first and second ranks (R1, R2) of memory. In the illustrated example of FIGS. 5 and 6, the burst length of the memory devices is 16 using a 8-bit wide data bus and the burst length of the channel bus to the memory controller is 16 using a 16-bit wide data bus.

Figure 7:
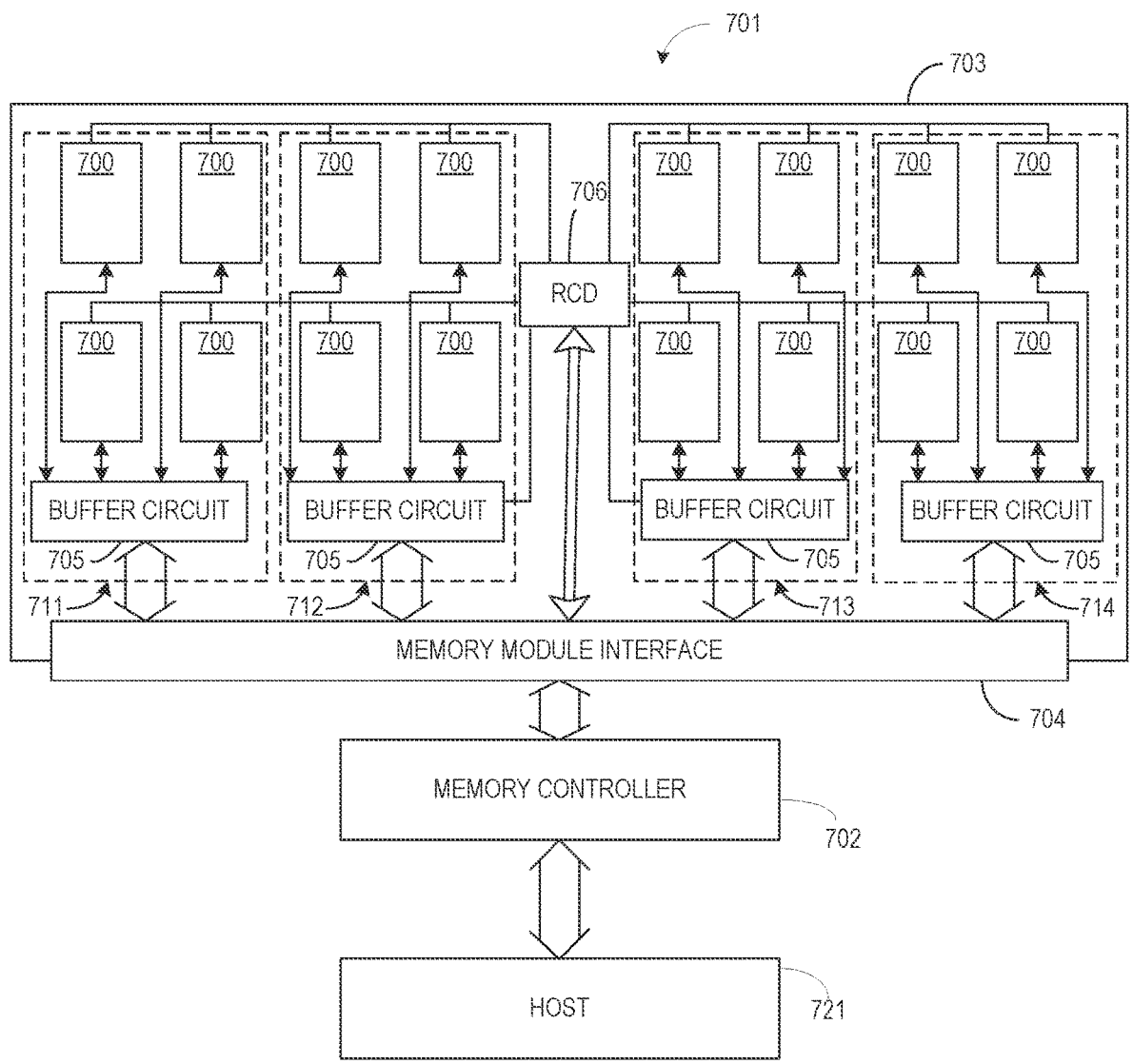
FIG. 7 is a simplified block diagram schematically illustrating a memory system in accordance with an embodiment of the present subject matter.

FIG. 7 is a simplified block diagram schematically illustrating a memory system 701 in accordance with an embodiment of the present subject matter. The system 701 can include a host device 721, a memory controller 702, and a memory module 703. The memory module can include multiple memory devices 700, an interface 704, one or more buffer circuits 705 and a registered or registering clock driver (RCD) 706. The memory devices 700 can be used to store data of the host 721. The interface 704 can provide a communication path between the host device 721 and the memory module 703. The buffer circuits 705 can assist in increasing a transaction rate of the memory module 703 as discussed below. The RCD 706 may be configured to communicate with the memory controller 702 (or host device 721) on a first side, and with the components of the memory module 703 on a second side. The RCD 706 may receive, for example, command, address, and clock signals. In some cases, these command signals may include register command words (RCWs); and in other examples may include buffer control words (BCWs). The RCD 706 may, in some examples, provide signals to control, and in some cases train, the multiple-port buffer circuits 705. In certain examples, the RCD 706 may be configured to communicate with the memory controller through a 32-bit data bus operating at an established data transfer rate and modulate data signals of the memory devices 700 at a slower transfer rate. As will be apparent to persons skilled in the art, the RCD 706 can implement additional functionality such as impedance calibration command/parity checking etc. Outputs of the RCD (for example, clock outputs command/address outputs control outputs etc. may be enabled in groups and/or otherwise individually controlled as desired.

The host device 721 can be operably coupled to the memory module 703 (e.g., a dual in-line memory module (DIMM)) via the memory controller 702. In some examples, the memory module 703 can include the memory controller 702. The memory controller 702 can be operably coupled by a bus or interface 704 to a plurality of memory devices 700.

In accordance with various examples of the present subject matter, the host device 721 can communicate with the memory module 703 to store and retrieve data in the memory devices 700. In the illustrated example, the memory controller 702 can communicate with the memory devices 700 via four channels 711, 712, 713, 714. In certain examples, the channels 711, 712, 713, 714 can be operated independently from each other. In some examples, the channels 711, 712, 713, 714 can share some signals such as command and address signals and can have independent data signals. In certain examples, the memory module 703 can include multiple-port channel buffer circuits 705. The multiple-port channel buffer circuits 705 can allow a transaction rate of the memory module interface 704 to be higher than a transaction rate of an individual memory device 700. In certain example, the multiple-port channel buffer circuits 705 can allow slower, but more energy efficient memory devices to be used with a memory controller 702 capable of higher transaction rates. In certain examples, the transaction rate of the memory controller 702 compared to the transaction rate of a memory device 700 can be 2 times faster, 4 times faster, or even higher. In some examples, a multiple-port channel buffer circuit 705 can allow for additional ranks of memory for the system 701 compared to an unbuffered memory module or a memory module with a simple two-port buffer circuit.

Figure 8A:
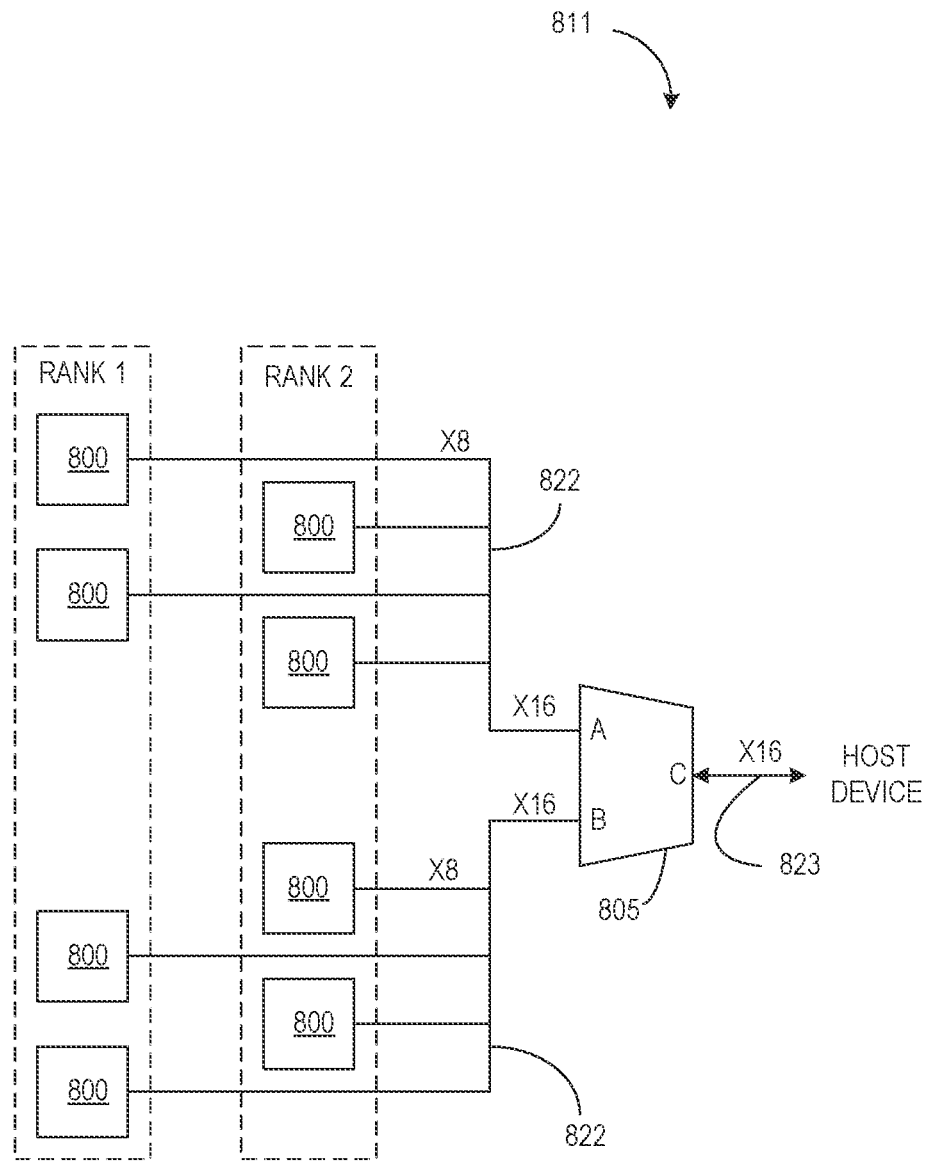
FIGS. 8A and 8B illustrate generally a block diagrams of a channel of an example four-channel memory module.
Figure 8B:
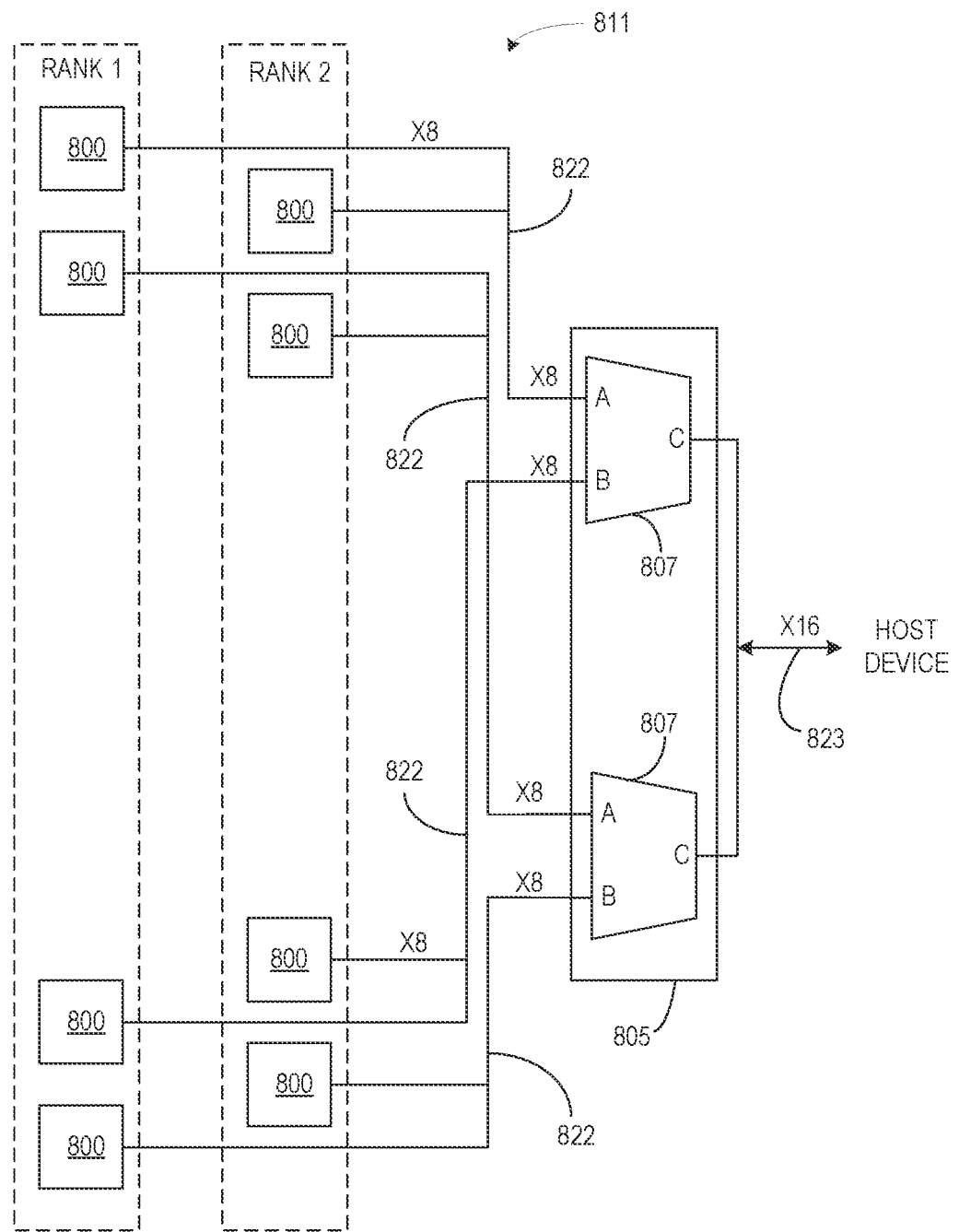

FIGS. 8A and 8B illustrate generally a block diagrams of a channel 811 of an example four-channel memory module. In certain examples, the channel 811 can include multiple memory devices 800, multiple data busses 822, a multiple-port channel butter circuit 805, and a channel data bus 823. In certain examples, the memory devices 800 can be organized by rank and a channel can include a first rank (RANK 1) of memory devices 800 and a second rank (RANK 2) of memory devices 800. The multiple-port channel buffer circuit 805 can simultaneously exchange data with each rank (RANK 1, RANK 2) of memory devices 800. In certain examples, the multiple-port channel buffer circuit 805 can exchange data with a memory controller/host device via the channel data bus 823 while simultaneously exchanging data with the one or more ranks (RANK 1, RANK 2) of memory of the memory devices 800. In some examples, the multiple-port channel buffer circuit 805 can include multiple, individual multiple-port data buffers 807 as shown in FIG. 8B. In the illustrated channel 811, each rank (RANK 1, RANK 2) of memory is coupled with more than one port (A, B) of the multiple-port channel buffer circuit 805. In certain examples, the multiple-port channel buffer circuit 805 can allow full utilization of the transaction rate of the connected memory controller or host while using memory devices 800 having a much slower transaction rate. For example, in examples of DDR6 memory modules employing example multiple-port channel buffer circuits, the transaction rate of the channel bus 823 can be 12,800 MT/sec while the memory data busses 822 operate at 6400 MT/sec. In certain applications, the example multiple-port channel buffer circuits 805 can allow for expected speed performance of the channel bus 823 while using more energy efficient, slower, and often less expensive memory devices 800. It is understood the upon reading and understanding the present subject matter, the multiple-port channel buffer circuit 805 can be designed out of an alternative combination of logic components that result in the same function.

Figure 9:
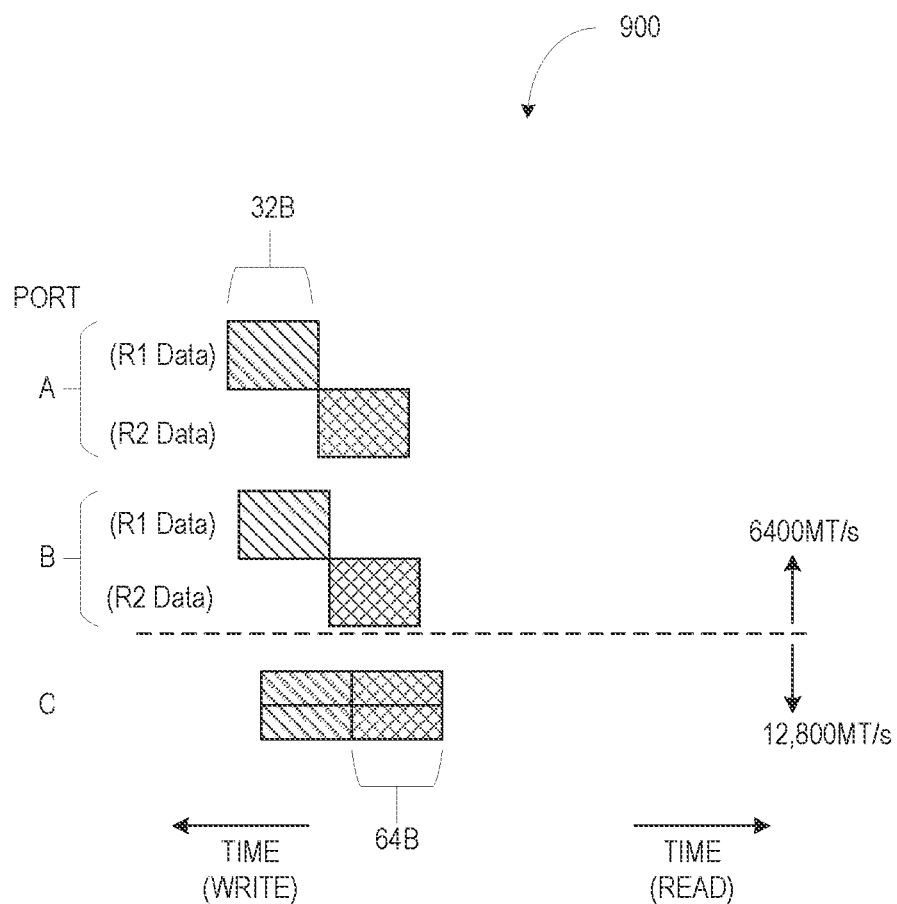
FIG. 9 illustrates graphically an example method of operating a memory module according to various examples of the present subject matter.

FIG. 9 illustrates graphically an example method 900 of operating a memory module according to various examples of the present subject matter. The method 900 of FIG. 9 illustrates the operation of an example memory module for a read operation and for a write operation. For a read operation, time flows from left to right. For a write operation, time flows from right to left. The particular example of FIG. 9 assumes the data for the read or write command is located in memory devices of a first rank (R1) and of a second rank (R2). An RCD of the memory module can receive the commands from the memory controller. For a read command, the RCD can command the memory of a first portion of the first rank (R1) to sense the first 32 bytes of read data and to forward the first read data to the memory module interface. A short delay after initiating the sensing of the first read data of the first rank (R1), the RCD can command the memory of a second portion of the first rank (R1) to sense a second 32 bytes of read data and forward the second read data to the memory module interface. Since the memory module includes a multiple-port channel buffer circuit, the memory devices of the first portion of the first rank (R1) and the memory devices of the second portion of the first rank (R1) can transfer the respective sensed data simultaneously. The multiple-port channel buffer circuit can use a first port (A) to receive the first read data and a second port (B) to receive the second read data.

Upon buffering a certain amount of first read data and of the second read data, the multiple-port channel buffer circuit can begin to send a first 64-byte chunk of read data to the host via a third port (C) of the multiple-port channel buffer circuit. In certain examples, the RCD can help schedule or arrange the order in which the data of each portion of each rank is sent to via the third port (C). In some examples, the multiple-port channel buffer circuit can send the data to the host in a predetermined order and arrangement without coordination other than clocking signals from the RCD. As can be observed from FIG. 9, the overlapping transfer of data enabled by using the multiple-port channel buffer circuit allows transfer rate of the memory devices to be half the transfer rate of the memory controller. If additional data is to be read, the RCD can continue to alternate sense commands to the different portions of the first and second ranks (R1, R2) of memory to retrieve the additional data.

For the write command, the RCD can coordinate reception of the write data with the memory controller. The multiple-port channel buffer circuit can use the third port (C) to receive write data from the host and can buffer the received write data. The RCD can coordinate transfer of the received write data from the multiple-port channel buffer circuit to memory of the first and second ranks (R1, R2). For example, soon after beginning to receive a first 64 bytes of first write data, the multiple-port channel buffer circuit can begin transferring first and second 32 bytes chunks of the first write data to first and second portions of memory of the second rank (R2) using the first and second ports (A, B) of the multiple-port channel buffer (time flowing from right to left in FIG. 9 for a write operation). Upon beginning to receive a second 64 bytes of second write data at the third port (C), the multiple-port channel buffer circuit can begin transferring third and fourth 32-byte chunks of the second write data to first and second portions of memory of the first rank (R1) using the first and second ports (A, B) of the multiple-port channel buffer circuit. In certain examples, transferring the first 32-byte chunk of write data from the multiple-port channel buffer circuit to the first portion of memory of the second rank (R2) and transferring the second 32-byte chunk of write data from the multiple-port channel buffer circuit to the second portion of memory of the second rank (R2) can happen simultaneously. If additional data is to be written as part of the write command, the RCD can continue to alternate the transfer of the additional write data to portions of the first and second ranks of memory. In the illustrated example of FIGS. 8 and 9, the burst length of the memory devices is 16 using an 8-bit wide data bus and the burst length of the channel to the memory controller is 32 using a 16-bit wide data bus.

The above examples illustrate examples of memory modules employing multiple-port channel buffer circuits having a 2:1 fanout and allowing a memory module to operate at a transaction rate that is two times greater than the transaction rate of the individual memory devices. In certain examples, buffer circuits with a 3:1 fanout or 4:1 fanout can be employed to allow a memory module to operate at even higher transaction rate ratios. Such examples can allow a memory module to operate at a transaction rate that can be four times higher than the rated transacting rate of an individual memory device of the memory module.

Figure 10:
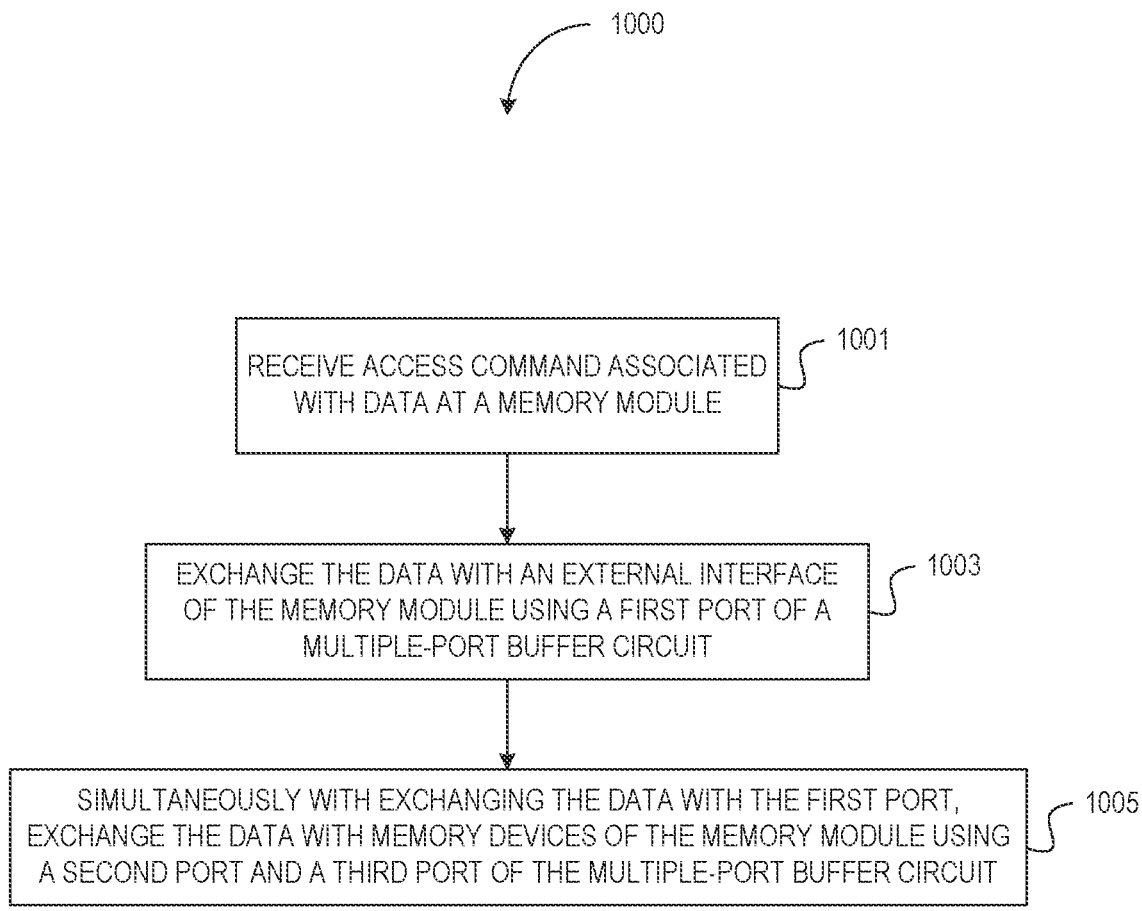
FIG. 10 illustrates generally a flowchart of an example method of operating a memory module to support a higher transaction rate than the memory devices of the memory module used for providing the storage capacity of the memory module.

FIG. 10 illustrates generally a flowchart of an example method 1000 of operating a memory module to support a higher transaction rate than the memory devices of the memory module used for providing the storage capacity of the memory module. At 1001, a memory access command can be received at the memory module. In certain examples, one or more RCDs of the memory module can receive the memory access command and can control or modulate the activities of the memory devices and various busses of the memory module to execute the memory access command. At 1003, data associated with the memory access command can be exchanged between a first port of a multiple-port buffer circuit of the memory module and an external interface of the memory module. The external interface is typically coupled to a host via memory controller, but the present subject matter is not so limited. For a write access command, the exchange can include receiving write data at the first port. For a read access command, the exchange can include transmitting the read data to a host device. At 1005, the data can be exchanged with the memory devices of the memory module using second and third ports of the multiple-port buffer circuit simultaneously with exchanging other portions of the data with the external interface. Thus, the multiple-port buffer circuit can allow a higher rate of transaction via the external interface compared to the transaction rate of the memory devices of the memory module.

Figure 11:
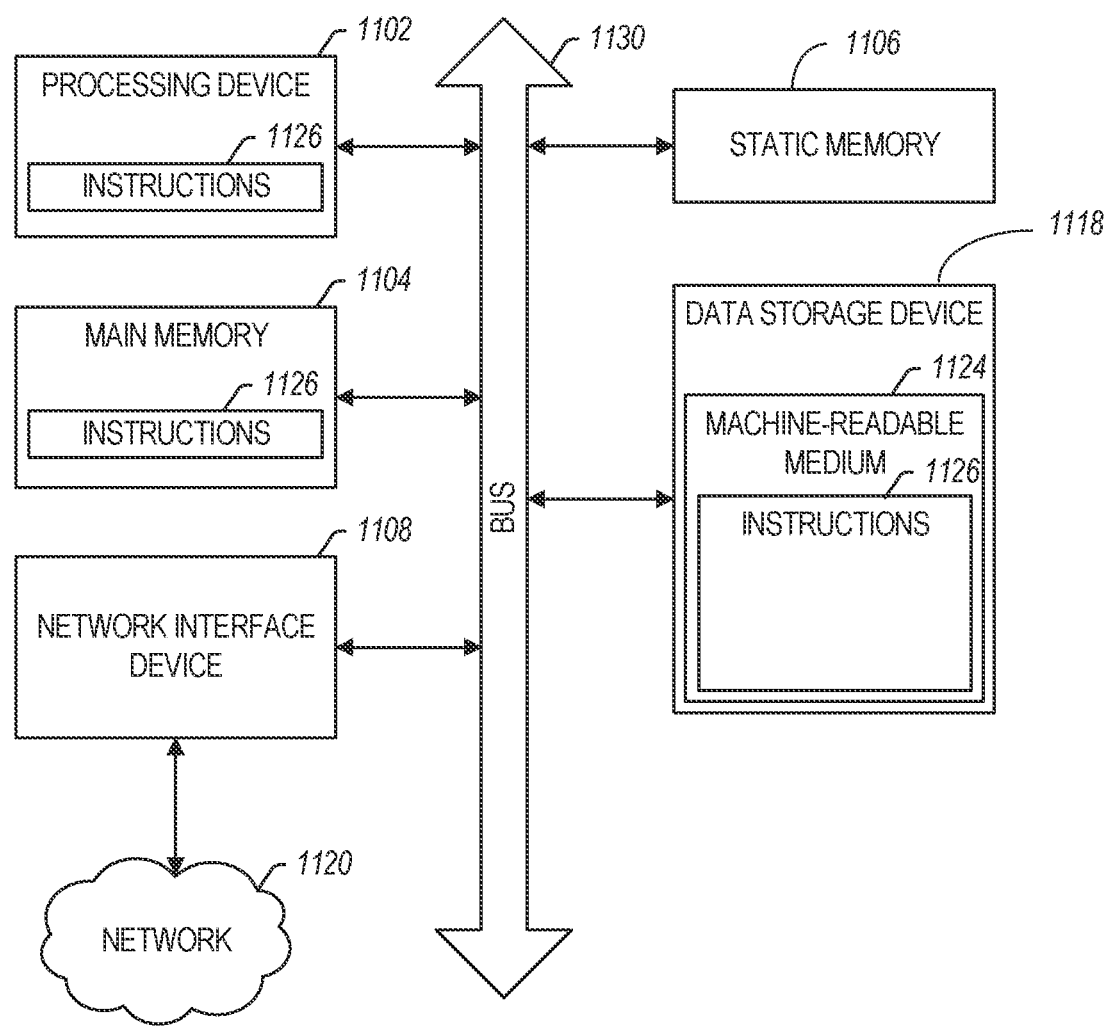
FIG. 11 illustrates generally a diagram of a system including a device that supports memory modules in accordance with aspects disclosed herein.

FIG. 11 illustrates a block diagram of an example machine 1100 upon which any one or more of the techniques (e.g., methodologies) discussed herein may perform. In alternative embodiments, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that, may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.)

encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1100 (e.g., the host 105, the memory device 110, etc.) may include a processing device 1102 (e.g., a hardware processor, a central processing unit (CPU), a graphics processing unit (GPU), a hardware processor core, or any combination thereof, such as a memory controller of the memory device 110, etc.), a main memory 1104 (e.g., read-only memory (ROM), flash memory, dynamic random-access memory (DRAM) such as synchronous DRAM (SDRAM) or Rambus DRAM (RDRAM), etc.), a static memory 1106 (e.g., flash memory, static random-access memory (SRAM), etc.), and a data storage system 1118, some or all of which may communicate with each other via an interlink (e.g., bus) 1130.

The processing device 1102 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1102 can also be one or more special-purpose processing devices such as an application specific integrated circuit (ASIC), a field programmable gate array (FPGA), a digital signal processor (DSP), network processor, or the like. The processing device 1102 can be configured to execute instructions 1126 for performing the operations and steps discussed herein. The computer system 1100 can further include a network interface device 1108 to communicate over a network 1120.

The data storage system 1118 can include a machine-readable storage medium 1124 (also known as a computer-readable medium) on which is stored one or more sets of instructions 1126 or software embodying any one or more of the methodologies or functions described herein. The instructions 1126 can also reside, completely or at least partially, within the main memory 1104 or within the processing device 1102 during execution thereof by the computer system 1100, the main memory 1104 and the processing device 1102 also constituting machine-readable storage media. The machine-readable storage medium 1124, the data storage system 1118, or the main memory 1104 can correspond to the memory device 100 of FIG. 1.

In one implementation, the instructions 1126 include instructions to implement functionality corresponding to providing the methodologies of FIG. 4, FIG. 6, FIG. 9, and FIG. 10. While the machine-readable storage medium 1124 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1100 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1100 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1126 (e.g., software, programs, an operating system (OS), etc.) or other data are stored on the data storage device 1118 can be accessed by the main memory 1104 for use by the processing device 1102. The main memory 1104 (e.g., DRAM) is typically fast, but volatile, and thus a different type of storage than the data storage device 1118 (e.g., an SSD) which is suitable for long-term storage, including while in an "off" condition. The instructions 1126 or data in use by a user or the machine 1100 are typically loaded in the main memory 1104 for use by the processing device 1102. When the main memory 1104 is full, virtual space from the data storage device 1118 can be allocated to supplement the main memory 1104; however, because the data storage device 1118 device is typically slower than the main memory 1104, and write speeds are typically at least twice as slow as read speeds, use of virtual memory can greatly reduce user experience due to storage device latency (in contrast to the main memory 1104, e.g., DRAM). Further, use of the data storage device 1118 for virtual memory can greatly reduce the usable lifespan of the data storage device 1118.

In contrast to virtual memory, virtual memory compression (e.g., the Linux™ kernel feature "ZRAM") uses part of the memory as compressed block storage to avoid paging to the data storage device 1118. Paging takes place in the compressed block until it is necessary to write such data to the data storage device 1118. Virtual memory compression increases the usable size of the main memory 1104, while reducing wear on the data storage device 1118.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 1124 may further be transmitted or received over a network 1120 using a transmission medium via the network interface device 1108 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1108 may include one or more physical jacks (e.g., Ethernet, coaxial, or phone jacks) or one or more antennas to connect to the network 1120. In an example, the network interface device 1108 may include a plurality of antennas to wirelessly communicate using at least one of single-input multiple-output (SIMO), multiple-input multiple-output (MEMO), or multiple-input single-output (MISO) techniques.

The term "transmission medium" shall be taken to include any intangible medium that is capable of storing, encoding, or carrying instructions for execution by the machine 1100, and includes digital or analog communications signals or other intangible medium to facilitate communication of such software. Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As may be used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The may be used herein, the term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of a memory array.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. In some examples, the substrate may be an organic build up substrate formed from materials such as ABF or BT. The conductivity of the substrate, or sub-regions of the substrate, may be controlled through doping using various chemical species including, but not limited to, phosphorous, boron, or arsenic.

Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine.

A processor may also be implemented as a combination of computing devices (e.g., a combination of a DSP and a microprocessor, multiple microprocessors, one or more microprocessors in conjunction with a DSP core, or any other such configuration).

In a first example, Example 1, a memory module can include a circuit board having an external interface, first memory devices mounted to the circuit board, and a first multiple-port buffer circuit mounted to the circuit board. The first multiple-port buffer circuit can include a first port coupled to data lines of the external interface, the first port configured to operate at a first transaction rate, a second port coupled to data lines of a first plurality of the first memory devices, and a third port coupled to data lines of a second plurality of the first memory devices. The second and third ports can be configured to operate at a second transaction rate, wherein the second transaction rate is slower than the first transaction rate. The memory module can be a dual in-line memory module (DIMM).

In Example 2, the memory devices of Example 1 optionally include a first rank of memory and a second rank of memory.

In Example 3, the second port of any one or more of Examples 1-2 optionally is configured to exchange data between the external interface and the first rank.

In Example 4, the second port of any one or more of Examples 1-3 optionally is not configured to exchange data between the external interface and the second rank.

In Example 5, the memory devices of any one or more of Examples 1-4 optionally includes a third rank of memory and a fourth rank of memory.

In Example 6, the first port of any one or more of Examples 1-5 optionally is configured to exchange data between the external interface, and the first and second ranks, and the second port of any one or more of Examples 1-5 optionally is configured to exchange data between the external interface, and the third and fourth ranks.

In Example 7, the first multiple-port buffer circuit of any one or more of Examples 1-6 optionally is configured to simultaneously exchange data with the first rank and with the second rank.

In Example 8, the first transaction rate of the first port of any one or more of Examples 1-7 optionally is two times greater than the transaction rate of the second port.

In Example 9, the first transaction rate of the first port of any one or more of Examples 1-8 optionally is four times greater than the transaction rate of the second port.

In Example 10, a transfer rate of the first port of any one or more of Examples 1-9 optionally is 12,800 mega-transactions per second (MT/s).

In Example 11, the memory module of any one or more of Examples 1-10 optionally includes a first channel and a second channel. The first channel can include the first memory devices, the first multiple-port buffer, and a first portion of a data bus of the external interface. The second channel can include second memory devices mounted to the circuit board, a second multiple-port buffer circuit, and a second portion of the data bus of the external interface. The second multiple-port buffer circuit can include a first port coupled to data lines of the external interface, a second port coupled to data lines of a first plurality of the second memory devices, and a third port coupled to data lines of a second plurality of the second memory devices.

In Example 12, wherein the first ports of the first and second channels of any one or more of Examples 1-11 optionally includes a data bus width of no more than 16 bits.

In Example 13, the first ports of the first and second channels of any one or more of Examples 1-11 optionally includes a data bus width of no more than 32 bits.

In Example 14, the memory module of any one or more of Examples 1-2 optionally includes four channels, the four channels including the first channel and the second channel.

In Example 15, the first multiple-port buffer circuit of any one or more of Examples 1-14 optionally includes multiple buffers, each buffer of the multiple buffers including a first data port coupled to the external interface, and two data ports coupled to the first memory devices, and a data width of a data bus of the first data port of any one or more of Examples 1-14 optionally is a portion of a data width of a data bus of the external interface.

In Example 16, a method of operating a dual in-line memory module (DIMM) can include receiving an access command associated with memory data at the memory module, exchanging the memory data with an external interface of the DIMM and a first port of a multiple-port buffer circuit of the DIMM, and exchanging the memory data with memory devices of the DIMM using a second port of the multiple-port buffer circuit and using a third port of the multiple-port buffer circuit, wherein exchanging the memory data with the memory devices includes simultaneously routing memory data via the second port and via the third port.

In Example 17, the receiving access command associated with memory data of any one or more of Examples 1-16 optionally includes receiving a read command of the memory data, and the exchanging the memory data with the memory devices of any one or more of Examples 1-16 optionally incudes simultaneously receiving the memory data from the memory devices at the second and third ports of the multiple-port buffer circuit.

In Example 18, the exchanging the memory data with an external interface of the DIMM and a first port of a multiple-port buffer circuit of any one or more of Examples 1-17 optionally includes sending a first portion of the memory data to a host via the third port and the external interface while simultaneously receiving a second portion of the memory data at the first and second ports.

In Example 19, the receiving access command associated with memory data of any one or more of Examples 1-18 optionally includes receiving a write command of the memory data, and the exchanging the memory data with an external interface of the DIMM and a first port of a multiple-port buffer circuit of any one or more of Examples 1-18 optionally includes receiving the memory data from a host via the third port and the external interface.

In example 20, the exchanging the memory data with the memory devices of any one or more of Examples 1-19 optionally incudes sending a first portion of the memory data to a first memory device using the first port, and sending a second portion of the memory data to a second memory device using the second port. The sending the second portion optionally is executed simultaneously with sending the first portion, and the sending the second portion is optionally executed simultaneously with receiving a third portion of the memory data at the third port.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

What is claimed is:

1. A dual in-line memory module (DIMM) comprising:
   a circuit board having an external interface;
   first memory devices mounted to the circuit board;
   a first multiple-port buffer circuit mounted to the circuit board, the first multiple-port buffer circuit comprising:
      a first port coupled to data lines of the external interface, the first port configured to operate at a first transaction rate;
      a second port coupled to data lines of a first plurality of the first memory devices; and
      a third port coupled to data lines of a second plurality of the first memory devices; and
   wherein the second and third ports are configured to operate at a second transaction rate, wherein the second transaction rate is slower than the first transaction rate.

2. The DIMM of claim 1, wherein the first memory devices include a first rank of memory and a second rank of memory.

3. The DIMM of claim 2, wherein the second port is configured to exchange data between the external interface and the first rank.

4. The DIMM of claim 3, wherein the second port is not configured to exchange data between the external interface and the second rank.

5. The DIMM of claim 2, wherein the first memory devices include a third rank of memory and a fourth rank of memory.

6. The DIMM of claim 5, wherein the first port is configured to exchange data between the external interface, and the first and second ranks; and
   wherein the second port is configured to exchange data between the external interface, and the third and fourth ranks.

7. The DIMM of claim 2, wherein the first multiple-port buffer circuit is configured to simultaneously exchange data with the first rank and with the second rank.

8. The DIMM of claim 1, wherein the first transaction rate of the first port is two times greater than the second transaction rate of the second port.

9. The DIMM of claim 1, wherein the first transaction rate of the first port is four times greater than the second transaction rate of the second port.

10. The DIMM of claim 1, wherein a transfer rate of the first port is 12,800 mega-transactions per second (MT/s).

11. The DIMM of claim 1, including:
    a first channel comprising:
       the first memory devices;
       the first multiple-port buffer circuit; and
       a first portion of a data bus of the external interface; and
    a second channel comprising:
       second memory devices mounted to the circuit board;
       a second multiple-port buffer circuit, the second multiple-port buffer circuit comprising:
          a first port coupled to data lines of the external interface;
          a second port coupled to data lines of a first plurality of the second memory devices; and
          a third port coupled to data lines of a second plurality of the second memory devices; and
       a second portion of the data bus of the external interface.

12. The DIMM of claim 11, wherein the first ports of each of the first and second multiple-port buffer circuits each include a data bus width of no more than 16 bits.

13. The DIMM of claim 11, wherein the first ports of each of the first and second multiple-port buffer circuits each include a data bus width of no more than 32 bits.

14. The DIMM of claim 11, including four channels, the four channels including the first channel and the second channel.

15. The DIMM of claim 1, wherein the first multiple-port buffer circuit includes multiple buffers, each buffer of the multiple buffers including a first data port coupled to the external interface, and two data ports coupled to the first memory devices; and
    wherein a data width of a data bus of the first data port is a portion of a data width of a data bus of the external interface.

16. A method of operating a dual in-line memory module (DIMM), the method comprising:
    receiving an access command associated with memory data at the memory module;
    exchanging the memory data with an external interface of the DIMM and a first port of a multiple-port buffer circuit of the DIMM; and
    exchanging the memory data with memory devices of the DIMM using a second port of the multiple-port buffer circuit and using a third port of the multiple-port buffer circuit, wherein exchanging the memory data with the memory devices includes simultaneously routing the memory data via the second port and via the third port.

17. The method of claim 16, wherein receiving the access command associated with the memory data includes receiving a read command of the memory data; and
    wherein exchanging the memory data with the memory devices incudes simultaneously receiving the memory data from the memory devices at the second and third ports of the multiple-port buffer circuit.

18. The method of claim 17, wherein exchanging the memory data with the external interface of the DIMM and the first port of the multiple-port buffer circuit includes sending a first portion of the memory data to a host via the third port and the external interface while simultaneously receiving a second portion of the memory data at the first and second ports.

19. The method of claim 16, wherein receiving the access command associated with the memory data includes receiving a write command of the memory data; and exchanging the memory data with the external interface of the DIMM and the first port of a multiple-port buffer circuit includes receiving the memory data from a host via the third port and the external interface.

20. The method of claim 19, wherein exchanging the memory data with the memory devices incudes:

sending a first portion of the memory data to a first memory device using the first port;

sending a second portion of the memory data to a second memory device using the second port;

wherein sending the second portion is executed simultaneously with sending the first portion; and wherein sending the second portion is executed simultaneously with receiving a third portion of the memory data at the third port.

* * * * *